United States Patent
Farrar

(10) Patent No.: US 6,844,253 B2
(45) Date of Patent: *Jan. 18, 2005

(54) SELECTIVE DEPOSITION OF SOLDER BALL CONTACTS

(75) Inventor: Paul A. Farrar, So. Burlington, VT (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,611

(22) Filed: Feb. 19, 1999

(65) Prior Publication Data

US 2001/0014524 A1 Aug. 16, 2001

(51) Int. Cl.[7] ............... H01L 21/44; H01L 21/4763; H01L 21/48
(52) U.S. Cl. ............... 438/612; 438/613; 438/637; 438/119
(58) Field of Search .................. 438/612, 613, 438/637, 675, 119, 108

(56) References Cited

U.S. PATENT DOCUMENTS

| | | | |
|---|---|---|---|
| 3,959,047 A | 5/1976 | Alberts et al. ................. | 156/8 |
| 4,273,859 A | 6/1981 | Mones et al. ................. | 430/315 |
| 4,650,548 A | * 3/1987 | Strube et al. | |
| 4,661,375 A | * 4/1987 | Thomas | |
| 4,789,648 A | 12/1988 | Chow et al. ................. | 437/225 |
| 4,790,912 A | * 12/1988 | Holtzman et al. | |
| 4,982,267 A | * 1/1991 | Mones et al. | |
| 5,240,878 A | 8/1993 | Fitzsimmons et al. ....... | 437/187 |
| 5,457,345 A | 10/1995 | Cook et al. ................. | 257/766 |
| 5,461,257 A | 10/1995 | Hundt ......................... | 257/707 |
| 5,642,261 A | 6/1997 | Bond et al. ................. | 361/704 |
| 5,693,572 A | 12/1997 | Bond et al. ................. | 437/209 |
| 5,736,789 A | * 4/1998 | Moscicki | |
| 5,885,891 A | * 3/1999 | Miyata et al. .............. | 438/612 |
| 5,973,340 A | * 10/1999 | Mohsen | |

OTHER PUBLICATIONS

Anonymous, "Combination Process for Final Metal Lines and Metal Terminals", Kenneth Mason Publications Ltd, Research Disclosure No. 342, England, 1, (Oct. 1992).

Anonymous, "Process for High Density of Chip Terminals on Large Wafers", Kenneth Mason Publications Ltd, Research Disclosure No. 02, England, 1, (Feb. 1993).

ASM International, "Packaging", ASM International Electrotronic Materials Handbook vol. 1, 301 and 440p.

(List continued on next page.)

*Primary Examiner*—John F. Niebling
*Assistant Examiner*—Ron E. Pompey
(74) *Attorney, Agent, or Firm*—Schwegman, Lundberg, Woessner & Kluth, P.A.

(57) ABSTRACT

Methods of forming solder ball contacts having dimensions of approximately 2.5 microns in diameter for use in C4-type connections. The methods form solder ball contacts using selective deposition of solder on metal contact pads of a device. The metal contact pads have exposed portions at the bottom of through holes. The through holes define the dimensions of the exposed portions of the metal contact pads, and serve to limit the dimensions of the resulting solder contact by limiting the area upon which deposition preferentially occurs. Subsequent reflow of the deposited solder forms a solder ball contact. Various devices, modules, systems and other apparatus utilizing such methods of forming solder ball contacts.

31 Claims, 13 Drawing Sheets

OTHER PUBLICATIONS

Marcotte, V.C., et al., "Review of Flip Chip Bonding", *Proceedings of the 2nd ASM International Electronic Materials and Processing Congress Apr. 24–28, 1989, Philadelphia, PA*, 73–81, (1989).

Pfeiffer, L., et al., "Self–Aligned Controlled Collapse Chip Connect (SAC4)", *Journal of the Electrochemical Society*, vol. 134, No. 11, 2940–2941, (Nov. 1987).

Ryan, J.G., et al., "Technology Challenges for Advanced Interconnects", 1–5 p.

Bohr, M.T., "Interconnect Scaling—The Real Limiter to High Performance ULSI", *IEEE*, pp. 241–244, (1995).

Davis, J., et al., "A Priori Wiring Estimations and Optimal Multilevel Wiring Networks for Portable ULSI Systems", *Electronic Components and Technology Conference*, pp. 1002–1008, (1996).

Gwennap, L., "IC Makers Confront RC Limitations, IBM Leads Move to Copper Interconnects; TI Deploys Low–k Dielectic", *Microdesign Resources*, Microprocessor Report, pp. 14–18, (Aug. 1997).

Kaanta, C., et al., "Dual Damascene: A ULSI Wiring Technology", *VMIC Conference*, 144–152, (Jun. 1991).

Lakshminarayana, S., "Multilevel Dual Damascene Copper Interconnections", Rensselaer Polytechnic Institute, Ph.d Thesis, pp. 1–205, (1997).

Licata, T., et al., "Dual Damascene AL Wiring for 256M DRAM", *VMIC Conference*, 596–602, (Jun. 1995).

Luther, B., et al., "Planar Copper–Polyimide Back end of the Line Interconnections for ULSI Devices", *1993 Proceedings 10th International VLSI Multilevel Interconnection Conference*, pp. 15–21, (1993).

Ryan, J.G., et al., "The evolution of interconnection technology at IBM", *IBM J. Res. Develop., 39 (4)*, pp. 371–381, (1995).

Singer, P., "New Interconnect Materials: Chasing the Promise of Faster Chips", *Semiconductor International*, pp. 52–56, (1994).

Taur, Y., et al., "CMOS scaling into the 21st century 0.1 micrometer and beyond", *IBM J. Res. Develop., 39 (1/2)*, pp. 245–260, (1995).

Vollmer, B., et al., "Recent advances in the application of collimated sputtering", *Thin Solid Films, 247*, pp. 104–111, (1994).

* cited by examiner

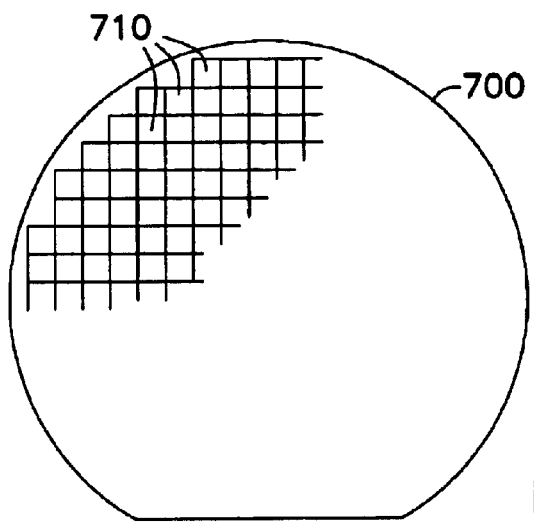
FIG. 8
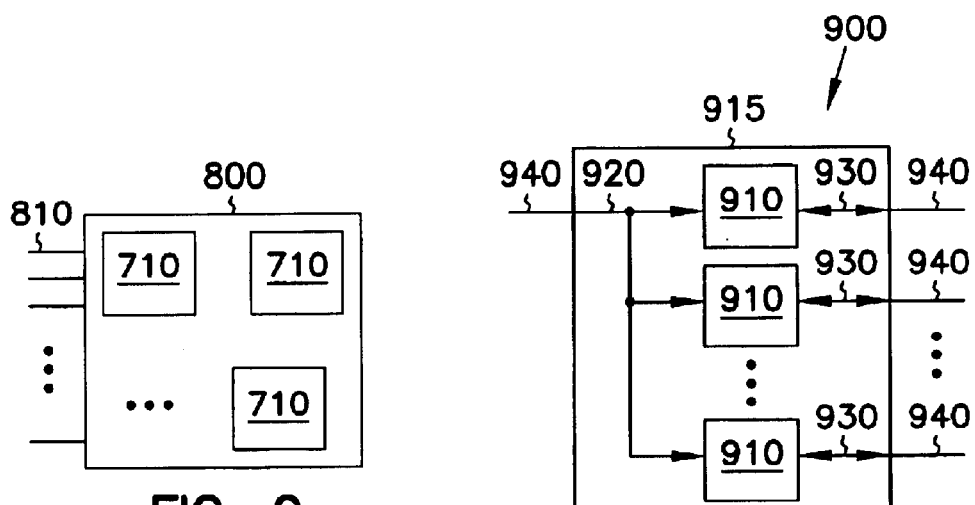
FIG. 9
FIG. 10
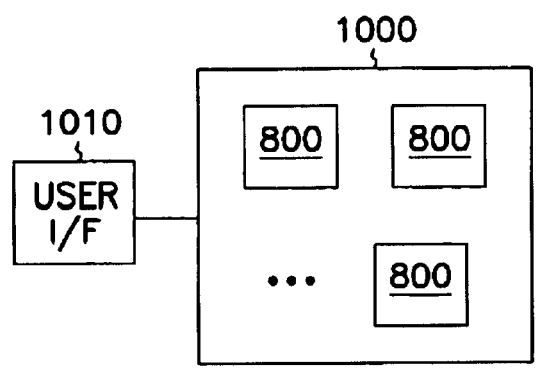
FIG. 11

SELECTIVE DEPOSITION OF SOLDER BALL CONTACTS

TECHNICAL FIELD

The invention relates generally to forming micro solder balls, and more specifically to forming micro solder balls through selective deposition for bonding integrated circuits to a module substrate or to a circuit board.

BACKGROUND INFORMATION

The central processing units (CPUs) of most modem day computers are typically provided on large circuit boards (mother boards) populated with various integrated circuit (IC) components, such as microprocessors and memory devices. These components contain integrated circuits formed on semiconductor dies, generally for performing a specific function. The components work in conjunction with one another to perform the various functions of the computer. Contacts on the mother board are connected to contacts on the components by the use of multi-chip modules or directly by conventional means, such as solder. The components are connected to one another by metal patterns formed on the surface of the module, mother board or other support. These metal patterns provide a conduit for data exchange between the components.

There is a constant need for computers that operate at faster rates. In order to accommodate this need, various techniques have developed to increase the rate (bandwidth) at which data can be processed and transmitted. One of these involves increasing the circuit complexity of the integrated circuits which also often results in a larger package for the semiconductor die, and an increase in the number of input/output (I/O) terminals required for the semiconductor die. Since the amount of data that can be accessed from or transferred to a component is directly proportional to the number of I/O lines its semiconductor die contains, increasing the number of I/O terminals directly increases data transfer and processing speed.

Traditionally, semiconductor dies were connected to leads with fine wires (wire bonding). This method of connection was limited by the number of pads which could be placed on the periphery of the semiconductor die. Considerable progress has been made in reducing the semiconductor die pad size, thereby increasing the number of pads. However, this technology is still limited by the number of pads which can be formed on the die periphery, and therefore the number of I/Os on a die is likewise limited. Therefore, other techniques have been developed over the years to increase the number of available I/O terminals and while accommodating alignment problems.

One of these techniques, known as Controlled Collapse Chip Connection (C4), was developed in the 1960s to deal with the problems associated with alignment of semiconductor dies on a substrate. This process also sought to increase the number of I/O terminals which could be made available for each semiconductor die. The C4 process uses solder bumps deposited on flat contacts on the semiconductor dies to form the bond between the semiconductor die and the leads. The contacts and solder balls on the semiconductor dies are matched with similar flat contacts on the leads to form the connection. Once the die is placed on top of the contacts, the entire device is heated to a temperature which melts the solder. As the solder is allowed to set, a reliable bond is formed between the chip and the leads.

One of the main advantages of this process is that the semiconductor die self-aligns itself on the module substrate based on the high surface tension of the solder. In other words, the chip need not be perfectly aligned over the contacts of the substrate. As long as it is in close proximity, the melting of the solder will align the chip with the substrate contacts. The other advantage of this process is that an increased number of I/O terminals can be fabricated for each semiconductor die as bonding pads are not limited to the periphery of the die. This type of bonding process is also often referred to as "flip-chip" or "micro-bump" bonding. The process can be briefly explained with reference to FIGS. 1 and 2.

FIG. 1 shows a side view of a semiconductor die 10 and a support 20. The semiconductor die 10 is fabricated with various metal pattern lines and contacts 50 imprinted on its last metal level, as shown in FIG. 2. Formed beneath the semiconductor die 10 is an array of solder balls 30. The support 20 includes metallized paths 60 for carrying signals from the semiconductor die 10 to other elements mounted on the support 20. These paths have contacts which match the contacts located on the underside of the semiconductor die 10. When the semiconductor die 10 is ready to be mounted, it is placed on top of the support 20 above the support contacts. The solder balls 30 attached to the contacts of the semiconductor die rest on the contacts of the support, as shown in FIG. 1. When the device is heated, the solder melts and the semiconductor die 10 self-aligns with the support contacts. The solder later hardens to form a reliable bond between the two sets of contacts. FIG. 3 shows the device after the solder has been heated and set.

Traditionally, the contacts and solder balls have been formed on the semiconductor die using metal mask technology. In this process, a metal mask (essentially a metal plate with a pattern of holes therein) is placed over a substrate containing many semiconductor dies for forming the contacts and solder balls. Then, contact material and solder are evaporated through the holes onto the wafer. The holes in the metal masks must be of sufficient size to prevent warpage and damage of the mask during use. Hence, the number of contacts that can be fabricated through use of a metal mask is limited because the holes in the mask must remain above a minimum size to prevent these problems. Consequently, the size of the solder balls that can be created is similarly limited.

The minimum diameter of a C4 solder ball commonly achieved using current techniques, such as metal mask, is approximately 100 microns. Since the size of the solder balls is directly related to the number and density of I/O terminals that can be fabricated on a given semiconductor die, a decrease in solder ball size would provide for an increase in the number and density of the I/O terminals. This would, in turn, allow for a significant increase in data transmission rates because of the increased number of I/O ports for the packaged IC component.

Hence, there is currently a need for a process for forming solder ball contacts which are less than 100 microns in diameter.

SUMMARY

The above-mentioned problems with I/O lines on a semiconductor die and other problems are addressed by the invention, and which will be understood by reading and studying the following specification.

One embodiment of the invention provides a method for forming solder ball contacts using selective deposition of solder on metal contact pads of a device. The metal contact pads have exposed portions at the bottom of through holes.

The through holes define the dimensions of the exposed portions of the metal contact pads, and serve to limit the dimensions of the resulting solder contact by limiting the area upon which deposition preferentially occurs. Subsequent reflow of the deposited solder contact forms a solder ball contact. Solder ball contacts in accordance with the invention are capable of attaining dimensions of approximately 2.5 microns in diameter.

In one embodiment, the selective deposition includes immersion contact by immersing the device in molten solder. The molten solder preferentially adheres to the exposed portions of the metal contact pads upon contact with the pads. Subsequent reflow of the deposited solder forms a solder ball contact.

In another embodiment, the selective deposition includes chemical vapor deposition of solder. Reactants capable of forming the solder preferentially adhere to the exposed portions of the metal contact pads. The reactants react to form a solder contact on the exposed portions of the metal contact pads. Subsequent reflow of the deposited solder contact forms a solder ball contact.

In a further embodiment, the selective deposition includes electrolytic deposition of solder. The solder preferentially forms on the exposed portions of the metal contact pads placed in a cathodic state. Subsequent reflow of the deposited solder forms a solder ball contact.

In a still further embodiment, the selective deposition includes electrolytic deposition of solder, where the solder is deposited using more than one layer of material. The layers of deposited material forming the solder preferentially form on the exposed portions of the metal contact pads placed in a cathodic state. Subsequent reflow of the deposited solder forms a solder ball contact.

Although particularly applicable for use as a replacement for the presently-used processes of forming C4-type connections on semiconductor dies, the same processes of the invention can also be used to form solder ball connections on other supports or substrates.

The above and other advantages and features of the invention will be better understood from the following detailed description of various embodiments of the invention which is provided in connection with the accompanying drawings.

BRIEF DESCRIPTION OF THE DRAWINGS

FIG. 8 is an elevation view of a wafer containing semiconductor dies in accordance with an embodiment of the invention.

FIG. 9 is a block diagram of an exemplary circuit module in accordance with an embodiment of the invention.

FIG. 10 is a block diagram of an exemplary memory module in accordance with an embodiment of the invention.

FIG. 11 is a block diagram of an exemplary electronic system in accordance with an embodiment of the invention.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense, and the scope of the invention is defined by the appended claims. Like numbers in the figures refer to like components, which should be apparent from the context of use.

One embodiment of a process of the invention is explained below with reference to FIGS. 4(A)–4(P). Although the following explanation refers to a technique for placing solder ball contacts on a semiconductor wafer, those skilled in the art will recognize that the process described below can be performed on a single semiconductor die. Further, it will also be apparent to those skilled in the art that the process described below can be used to form solder balls on circuit boards or other support structures.

Figure 1:
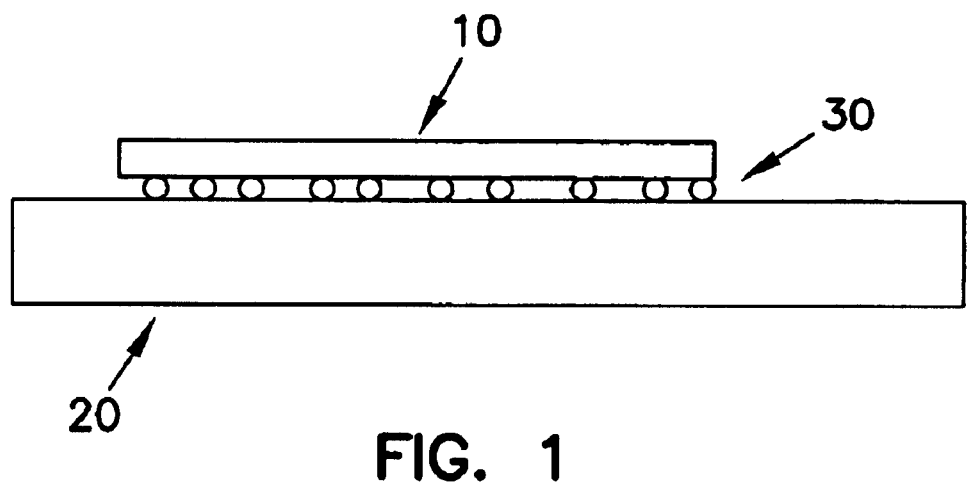
FIG. 1 is a plan view of an integrated circuit package before C4 bonds are created.
Figure 2:
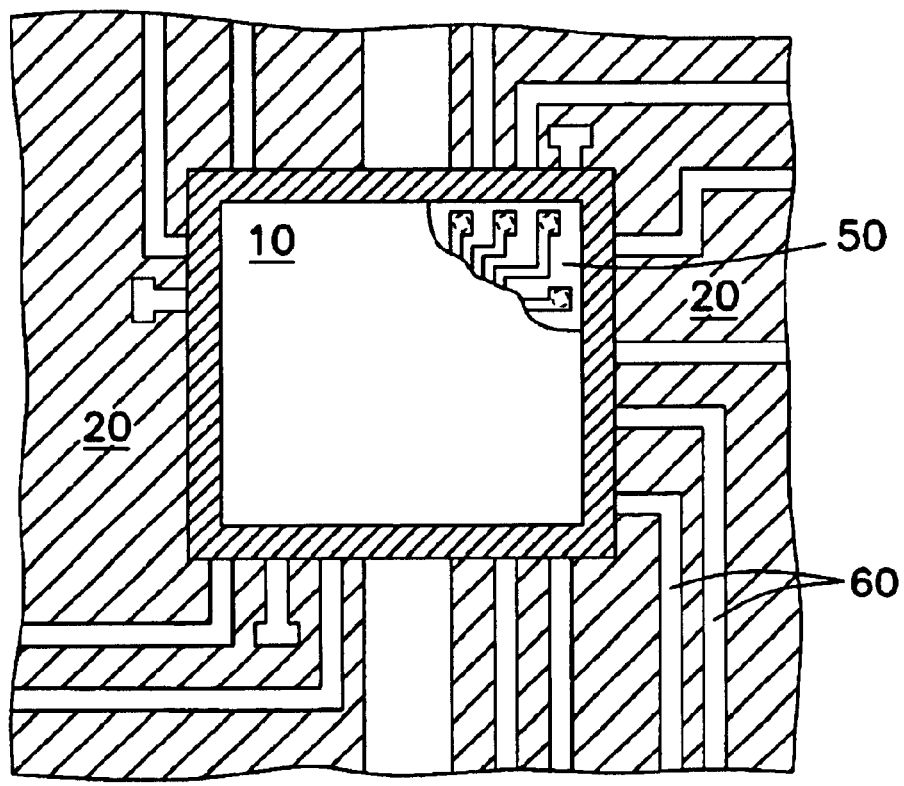
FIG. 2 is an elevation view of an integrated circuit package.
Figure 3:
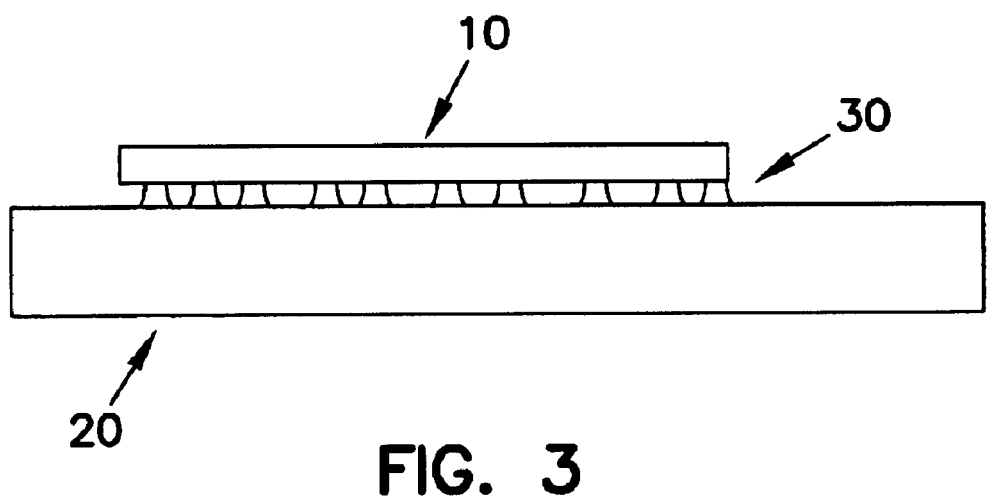
FIG. 3 is a plan view of an integrated circuit package after the C4 bonds are created.
Figure 4A:
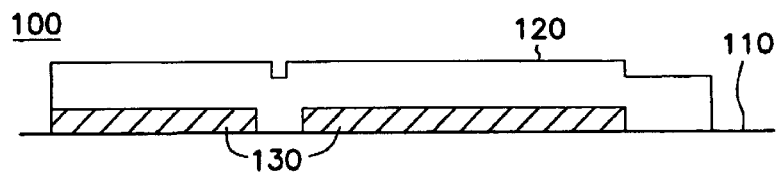
FIGS. 4(A)–4(P) are cross-sectional views of an integrated circuit structure in accordance with one embodiment of the invention.
Figure 4B:
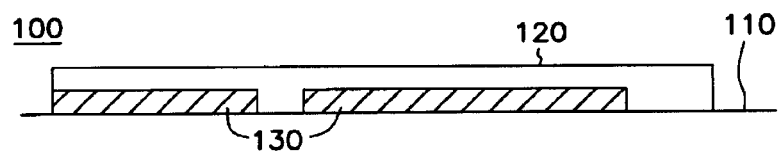
Figure 4C:
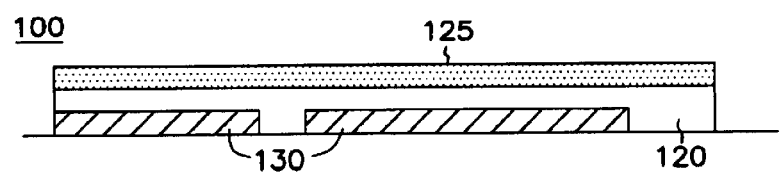
Figure 4D:
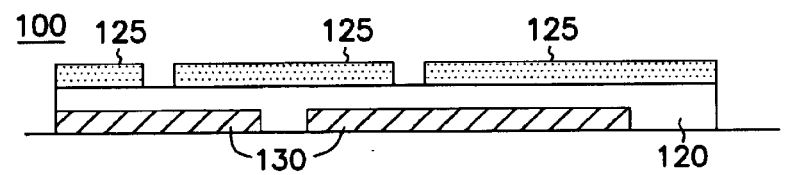
Figure 4E:
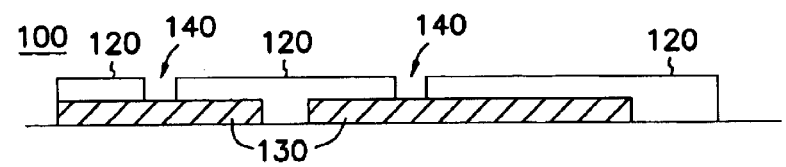
Figure 4F:
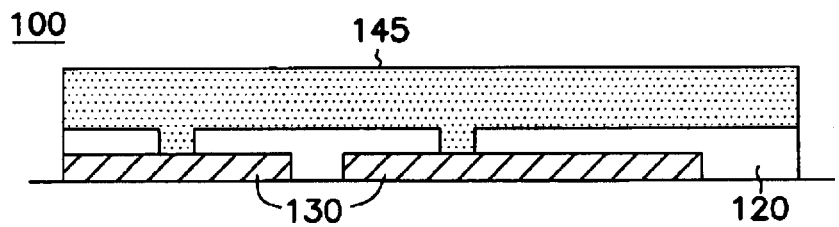
Figure 4G:
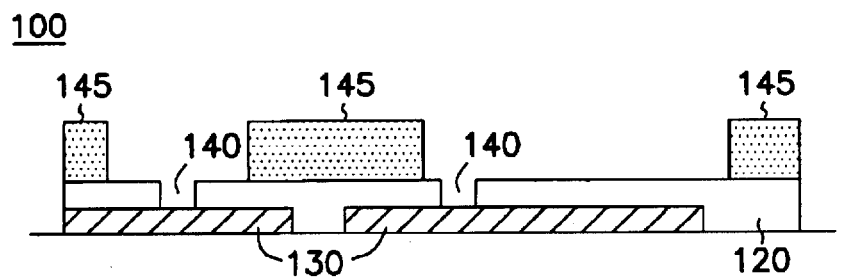
Figure 4H:
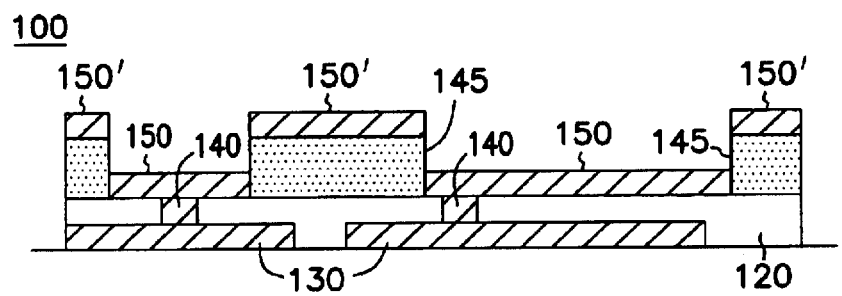
Figure 4I:
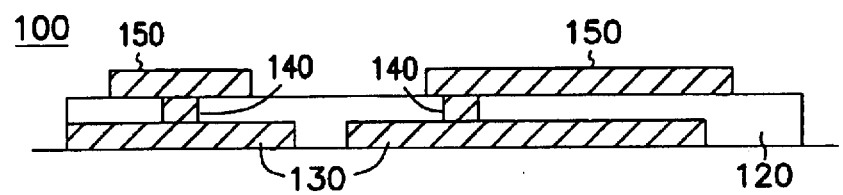
Figure 4J:
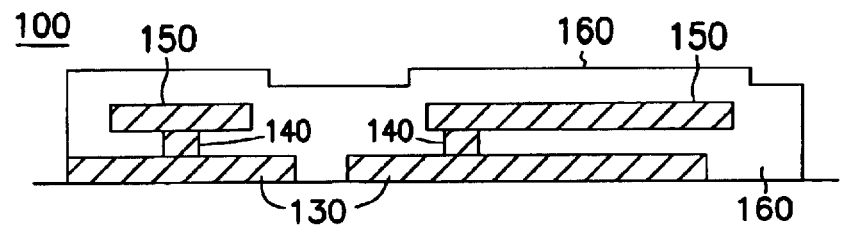
Figure 4K:
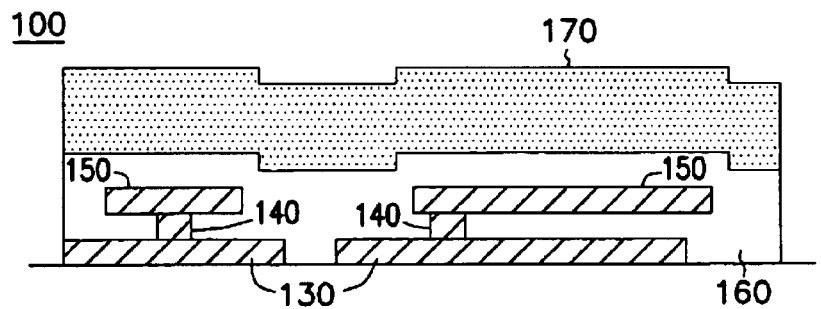
Figure 4L:
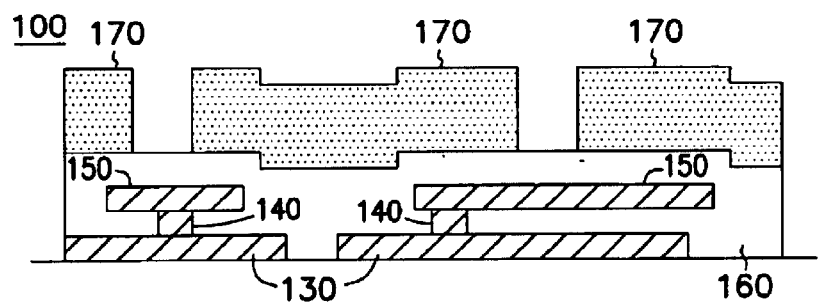
Figure 4M:
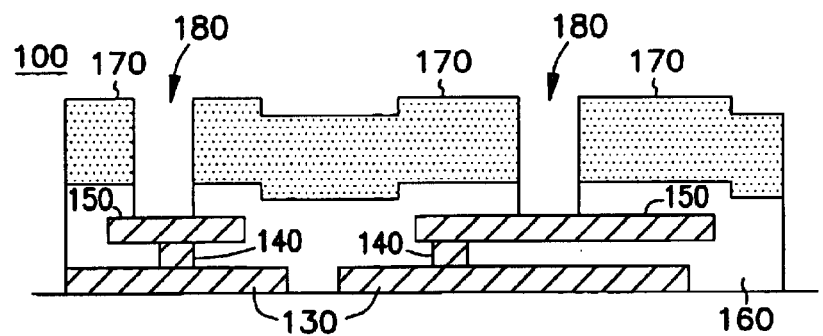
Figure 4N:
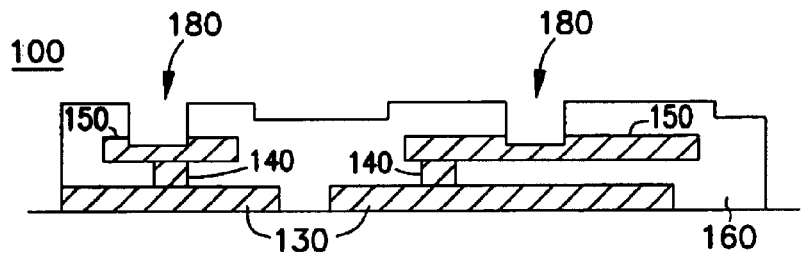
Figure 4O:
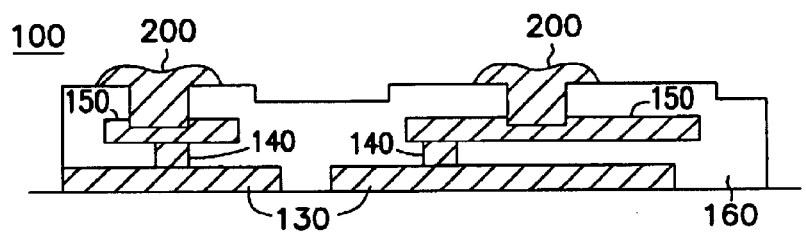
Figure 4P:
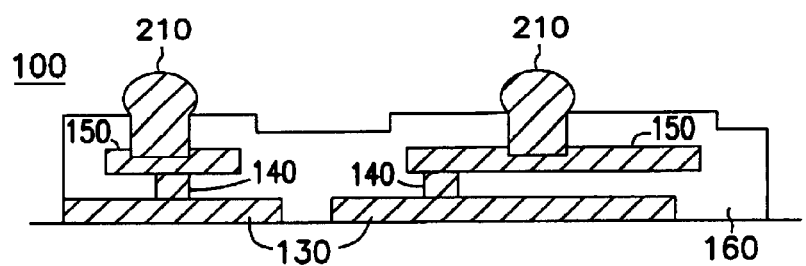

FIGS. 4(A)–4(P) illustrate the inventive process steps used to create micro solder balls on a semiconductor wafer 110. FIG. 4(A) shows the first stage in the formation of the micro solder balls on the wafer 110. At this stage, an insulating layer 120, such as silicon dioxide ($SiO_2$), is deposited on the next to last layer of metallurgy 130 of the wafer 110 by a process such as chemical vapor deposition (CVD). The next to last layer of metallurgy 130 includes the metal pattern lines that are coupled to internal circuitry contained on the semiconductor wafer 100. Although CVD silicon dioxide is preferred for the first insulating layer, other insulators (e.g., polyimide, silicon nitride, fluorinated silicon dioxide) known to those skilled in the art may also be used and deposited by conventional techniques. The insulating layer 120 should be applied so that its thickness is at least approximately 2 microns greater than the thickness of the next to last metal layer 130. Then, the structure 100 is planarized using a chemical mechanical polishing process (CMP). The resulting device, after polishing, is as shown in FIG. 4(B), where the excess insulating material has been smoothed away.

Next, as shown in FIG. 4(C), a first layer of photoresist 125 is deposited over the insulating layer 120. This photoresist layer 125 may be made of any type of photoresist known to those skilled in the art. The photoresist layer 125 is patterned, as shown in FIG. 4(D), to define future via holes. The patterned photoresist layer 125 is then used to etch into and remove portions of the insulating layer 120. FIG. 4(E) shows the device after the photoresist layer 125 has been exposed, the via holes 140 have been etched, and the photoresist layer 125 has been removed. These via holes 140 provide a connection for upper conductive levels to the next to last layer of metallurgy 130.

Next, solderable metal contact pads 150 are formed on the upper surface of the insulating layer 120. This is accomplished by depositing a second photoresist layer 145 on the planarized insulating layer 120, which will be used as a liftoff layer.

FIG. 4(F) shows the device 100 after the photoresist layer 145 has been placed over the insulating layer 120. An insulator such as polyimide may also be used in place of the photoresist layer 145, but it has been found that photoresist provides the best results in the invention. This photoresist layer 145 should be approximately 1.5 microns thick. After it is deposited, the photoresist layer 145 is patterned and etched down to the insulating layer 120 leaving exposed those areas on layer 120 where the metal contact pads 150 are desired, as shown in FIG. 4(G). Then, a metal stack preferably containing Zirconium (Zr), Nickel (Ni), Copper (Cu), Gold (Au) and Lead (Pb) is formed overtop of the entire device 100 including over the remaining areas of photoresist layer 145 and in the etched areas. This stack is formed by applying the five different metals, one at a time, and preferably in the order presented, using methods known in the art. The thicknesses of each layer of metal is preferably approximately 500 Angstroms of Zr, 750 Angstroms of Ni, 5000 Angstroms of Cu, 750 Angstroms of Au and 500 Angstroms of Pb, although these thicknesses are not critical. These metal layers are deposited to form metal stacks 150 in the etched areas of the photoresist layer 145, and to form excess metal stacks 150' on top of the photoresist layer 145. It will be recognized that other metallurgy can be utilized to form metal stacks 150 and 150'.

Since the photoresist layer 145 and the metal layers 150, 150' are applied over the entire surface of the device 100, it is necessary to remove the unwanted metal 150' and photoresist 145 prior to the next process step. FIG. 4(H) shows the device 100 after all metal layers have been deposited. The excess metal areas 150' which lie overtop of the photoresist layer 145, must now be removed. This is accomplished by a liftoff process. Liftoff processes are a well known method for removing unwanted portions of a device under fabrication. The present inventor has found that a tape-assisted liftoff process is especially beneficial in the disclosed process. Tape liftoff processes, per se, are known in the art, as evidenced by U.S. Pat. No. 5,240,878 to Fitzsimmons, which is incorporated herein by reference. Tape liftoff processes are frequently used to remove unwanted photoresist levels once an imaging and etching has taken place.

The tape utilized is an adhesive-backed polymer (not shown), which is applied overtop of the entire metallized resist layer, so that it contacts metal stacks 150'. The tape bonds to the metal stacks 150', which are, in turn, bonded to the photoresist layer 145. The removal of the tape causes all of the metal stacks 150' and photoresist 145 to be stripped away, leaving metal contact pads 150 in only those areas which were previously etched in the photoresist layer 145. The resulting device 100 after the tape liftoff appears as shown in FIG. 4(I).

After the metal contact pads 150 have been formed, a second insulating layer 160 is added overtop of the device 100, as shown in FIG. 4(J). This insulating layer 160 can be formed of conventional insulating material, such as polyimide, and is preferably approximately 1.5 microns thick. Although polyimide is preferred for this layer, any insulator known to those skilled in the art may be used (e.g., silicon dioxide, silicon nitride, fluorinated silicon dioxide).

FIG. 4(K) shows the next step where a third photoresist layer 170 is deposited. The photoresist layer 170 is preferably approximately 2.5 microns thick. The photoresist layer 170 is exposed and patterned, as shown in FIG. 4(L), to define through holes 180 in the areas above the metal contact pads 150. Then, the insulator 160 is etched through the holes 180 so that portions of the metal contact pads 150 are exposed, as shown in FIG. 4(M).

Next, as shown in FIG. 4(N), the photoresist layer 170 is removed from device 100. In one embodiment, solder is selectively deposited on the exposed portions of metal contact pads 150, forming solder contacts 200 in the through holes 180, by immersing the device 100 in molten solder. The molten solder will selectively attach to the exposed metal upon contact, forming solder contacts 200 shown in FIG. 4(O).

Solder contacts 200 which connect with metal contact pads 150 project out of the top surface of insulating layer 160. In a further step, the solder contacts 200 may be heated, preferably in a $H_2$ ambient, to allow them to reflow. When the solder contacts 200 are reflowed they reshape to form solder ball contacts 210, approximating a spherical shape as shown in FIG. 4(P) due to minimization of stress, and the surface tension of the molten solder. The solder may be a lead-tin solder (PbSn), bismuth solders or other solders known in the art.

Another embodiment is also described with reference to FIGS. 4(A)–4(P). In this embodiment, after the removing the photoresist layer 170 as shown in FIG. 4(N), solder is selectively deposited on the exposed portions of metal contact pads 150, forming solder contacts 200 in the through holes 180. The solder is selectively deposited on device 100 using selective chemical vapor deposition (CVD). CVD utilizes reactive gaseous or vaporized components, i.e., reactants, which combine to form a desired species and, often, a gaseous by-product. The reactants are fed into a reaction chamber such that the reactants contact a substrate on which deposition is to occur. The mechanism generally involves the reactants being adsorbed on the substrate surface, where they undergo a film-forming chemical reaction thus forming a film on the substrate surface. The film contains the desired species, and by-products are generally removed from a reaction chamber through venting or purging. In this embodiment, the reactants for a metal species should preferentially be adsorbed on the exposed portions of the metal contact pads 150. Subsequent reaction of reactants adsorbed on the exposed portions of the metal contact pads 150 form solder contacts 200 shown in FIG. 4(O).

As with the previous embodiment, solder contacts 200 which connect with metal contact pads 150 project out of the top surface of insulating layer 160. In a further step, the solder contacts 200 may be heated, preferably in a $H_2$ ambient, to allow them to reflow. When the solder contacts 200 are reflowed they reshape to form solder ball contacts 210, approximating a spherical shape as shown in FIG. 4(P) due to minimization of stress, and the surface tension of the molten solder.

Figure 5A:
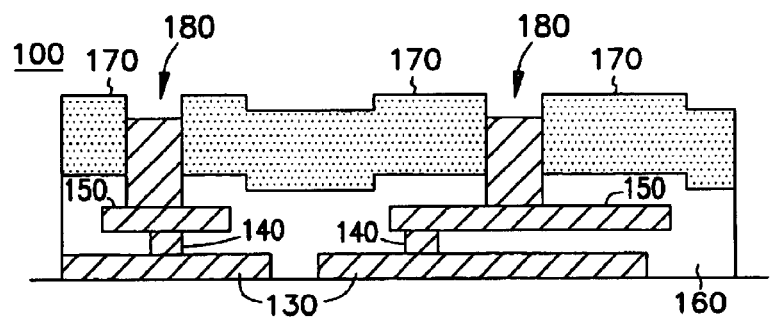
FIGS. 5(A)–5(C) are cross-sectional views of an integrated circuit structure in accordance with another embodiment of the invention.

A further embodiment is described with reference to FIGS. 4(A)–4(M) and 5(A)–5(C). In this embodiment, processing proceeds to the etching of through holes 180 to metal contact pads 150 as shown in FIG. 4(M). Instead of removing the resist at this stage, as in the previous embodiments, solder is applied to the exposed portions of metal contact pads 150 through electrolysis, or electrolytic deposition. Electrolytic deposition generally utilizes a conductive solution of a solvent and an ionically dissociated solute. Through the application of electrical current, metal is deposited at a cathode from a solution containing metal ions. By contacting the exposed portions of the metal contact pads 150 with a conductive solution containing metal ions and placing the metal contact pads 150 in a cathodic state, i.e., making them negative electrodes, solder is selectively deposited on metal contact pads 150 as current is passed through the conductive solution. The deposited solder forms solder contacts 200 as shown in FIG. 5(A). Solder contacts 200 are preferably about 2.33 microns deep.

Figure 5B:
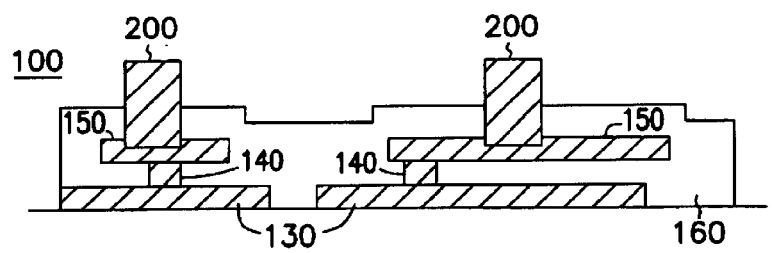
Figure 5C:
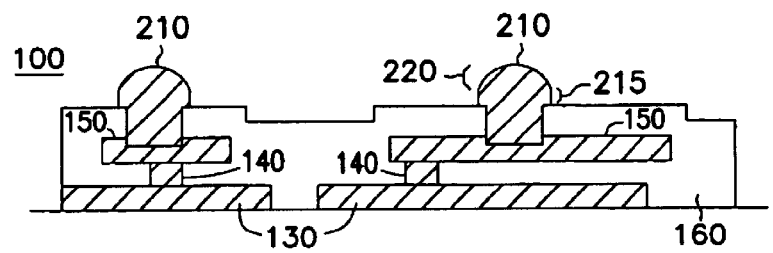

Photoresist layer 170 is then removed, exposing solder contacts 200 above the surface of insulating layer 160 as shown in FIG. 5(B). In a further step, the solder contacts 200 may be heated, preferably in a $H_2$ ambient, to allow them to reflow. When the solder contacts 200 are reflowed they may reshape to form solder ball contacts 210, approximating a spherical shape similar to those shown in FIG. 4(P) due to minimization of stress, and the surface tension of the molten solder. Alternatively, by limiting the annealing conditions, i.e., time and temperature, such that the solder contacts 200 are not fully molten, solder ball contacts 210 may be composite contacts, including both a flat contact portion 215 and a spherical portion 220 in a single unit as shown in FIG. 5(C).

Figure 6A:
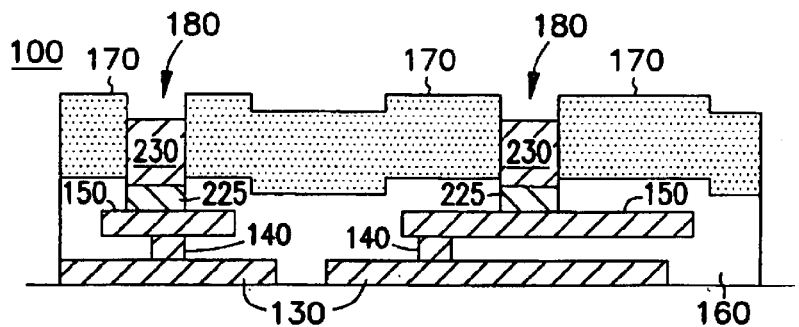
FIGS. 6(A)–6(C) are cross-sectional views of an integrated circuit structure in accordance with still another embodiment of the invention.

A still further embodiment is described with reference to FIGS. 4(A)–4(M) and 6(A)–6(C). In this embodiment, processing proceeds to the etching of through holes 180 to metal contact pads 150 as shown in FIG. 4(M). Instead of removing the resist at this stage, a layer of lead 225 is applied to the exposed portions of metal contact pads 150 through electrolysis. A layer of tin 230 is then formed on the layer of lead 225. The lead layer 225 is preferably approximately 0.91 microns deep. The tin layer 230 is preferably approximately 1.42 microns deep. The lead layer 225 and the tin layer 230 collectively form the solder contacts 200 as shown in FIG. 6(A). Other metallurgies may be substituted for the lead/tin combination, and the deposition may include more than two layers.

Figure 6B:
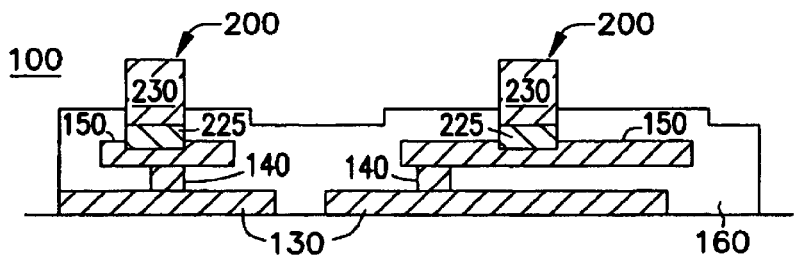
Figure 6C:
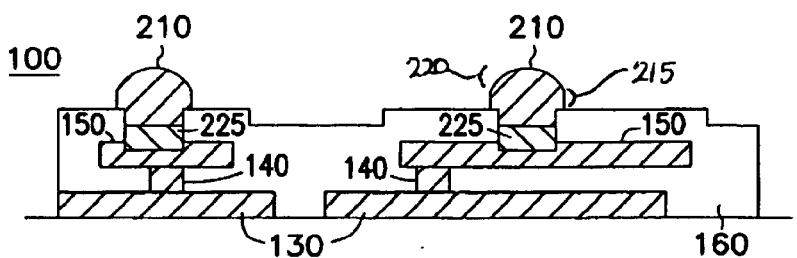

Photoresist layer 170 is then removed, exposing solder contacts 200 above the surface of insulating layer 160 as shown in FIG. 6(B). In a further step, the solder contacts 200 may be heated, preferably in a $H_2$ ambient, to allow them to reflow. When the solder contacts 200 are reflowed they may reshape to form solder ball contacts 210, approximating a spherical shape similar to those shown in FIG. 4(P) due to minimization of stress, and the surface tension of the molten solder. Alternatively, by limiting the annealing conditions, i.e., time and temperature, such that the solder contacts 200 are not fully molten, solder ball contacts 210 may be composite contacts, including both a flat contact portion 215 and a spherical portion 220 in a single unit as shown in FIG. 6(C).

Because these solder ball contacts of the invention are formed by selective deposition of solder using fine closely spaced holes, the size of the contacts is decreased significantly. Solder contacts formed in accordance with the invention are capable of attaining dimensions of approximately 2.5 microns in diameter, using a hole of approximately 2 microns in diameter. This is a significant improvement over the prior art solder ball contacts previously described, which are currently on the order of 100 microns in diameter.

Although the invention can be used to form solder ball contacts which are approximately 2.5 microns in diameter, it can also be used by those skilled in the art to produce solder contacts of other sizes, but particularly those in the range of 2.5 microns to 100 microns. For example, it might be desirable to form solder contacts of 10, 25, 50 or 75 microns, or any other size in the range of 2.5 to 100 microns, or in a narrower range such as less than 50 microns, or less than 25 microns, or less than 10 microns, as non-limiting examples.

Memory Devices

Figure 7:
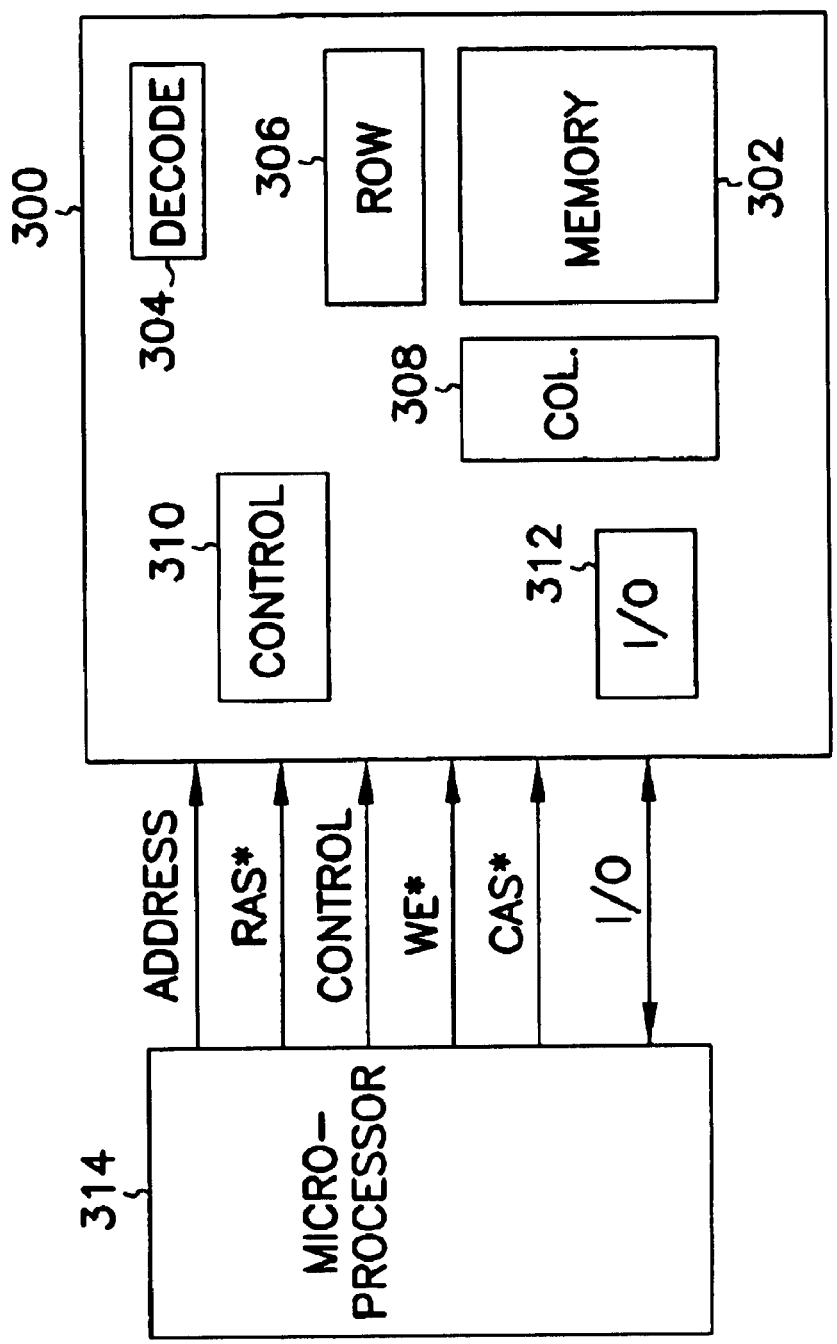
FIG. 7 is a block diagram of an integrated circuit memory device in accordance with an embodiment of the invention.

FIG. 7 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 7 has been simplified to help focus on the invention. Thus, the memory includes internal circuitry, metal pattern lines coupled to the array of memory cells and internal circuitry, and metal contact pads coupled to the metal pattern lines. At least one of the metal contact pads is coupled to a solder ball contact of the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. A substrate is often a silicon wafer, but can additionally refer to silicon-on-insulator (SOI) technology, silicon-on-sapphire (SOS) technology, thin film transistor (TFT) technology and other applicable support structures. The integrated circuits are typically repeated multiple times on each substrate. The substrate is further processed to separate the integrated circuits into dies as is well known in the art.

Semiconductor Dies

With reference to FIG. 8, in one embodiment, a semiconductor die 710 is produced from a silicon wafer 700. A die is an individual pattern, typically rectangular, on a substrate that contains circuitry, or integrated circuit devices, to perform a specific function. The integrated circuit devices of semiconductor die 710 are coupled to metal pattern lines. The metal pattern lines are coupled to metal contact pads. At least one of the metal contact pads is coupled to a solder ball contact as disclosed herein. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

As shown in FIG. 9, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

FIG. 10 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 10.

Electronic Systems

FIG. 11 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 12:
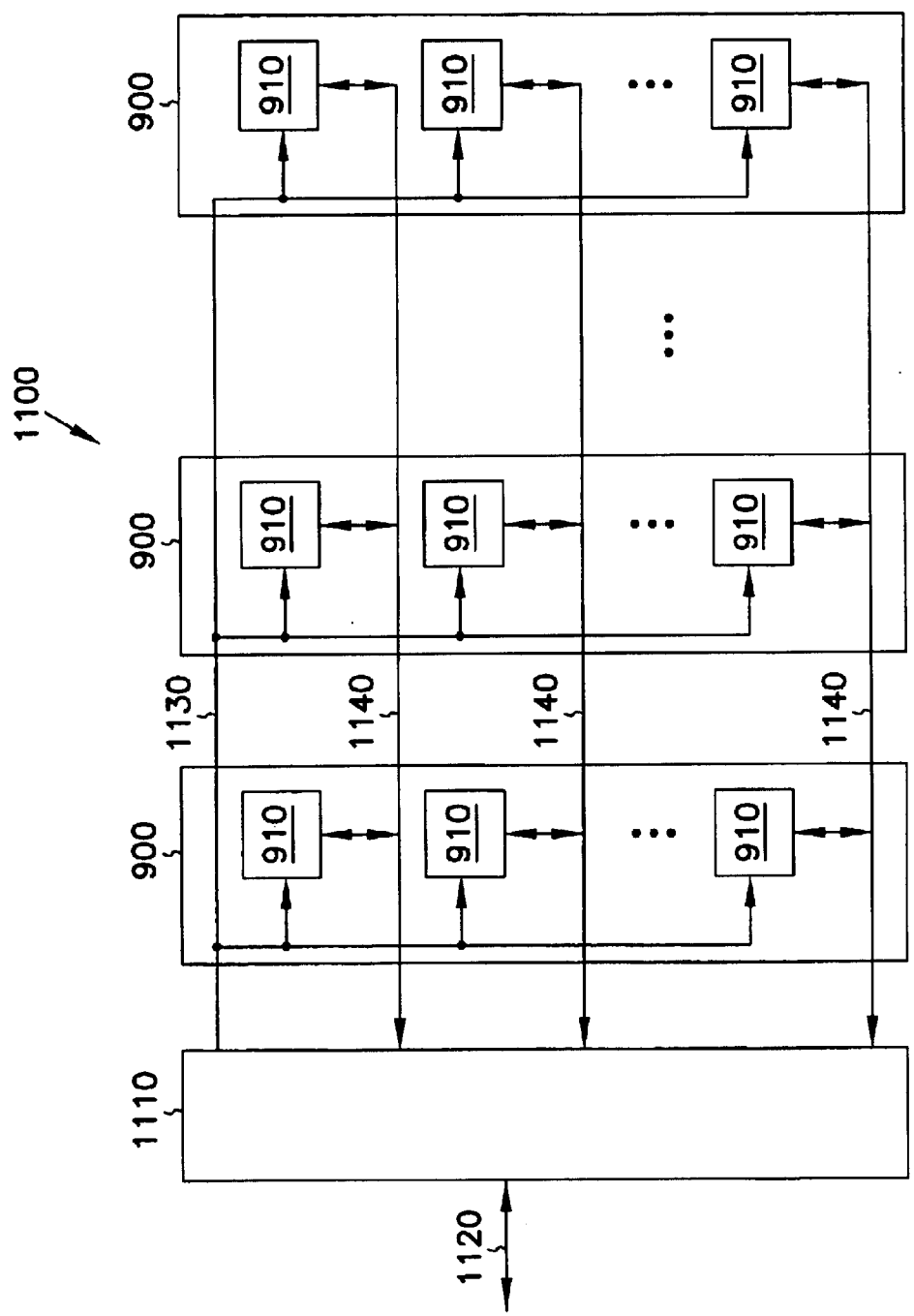
FIG. 12 is a block diagram of an exemplary memory system in accordance with an embodiment of the invention.

FIG. 12 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 13:
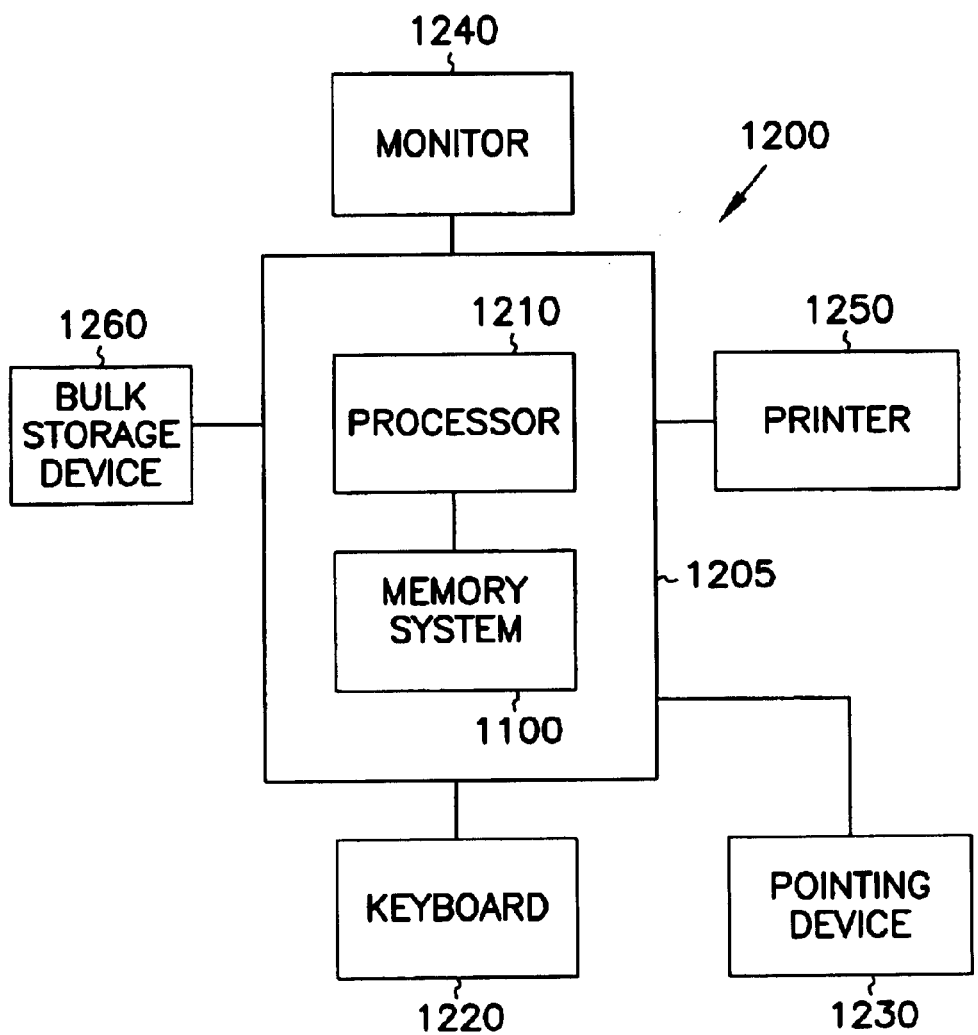
FIG. 13 is a block diagram of an exemplary computer system in accordance with an embodiment of the invention.

FIG. 13 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 13 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Methods of forming solder ball contacts having dimensions of approximately 2.5 microns in diameter have been described. Various devices, modules, systems and other apparatus utilizing the solder ball contacts of the invention have been further described. Apparatus utilizing the solder ball contacts of the invention are capable of increased I/O density over conventional C4 technologies.

While the invention has been described and illustrated with respect to forming solder ball contacts on a semiconductor die, it should be apparent that the same processing techniques can be used to form solder ball contacts on a support, a printed circuit board or other conductor-bearing substrate.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other methods of producing the metal contact pads and through holes may be used without departing from the scope of the invention. In addition, other metallurgies may be used for the solder or the metal contact pads. Accordingly, this application is intended to cover any adaptations or variations of the invention. It is manifestly intended that this invention be limited only by the following claims and equivalents thereof.

What is claimed is:

1. A method of forming a solder ball contact, comprising:
   forming a metal contact pad on a substrate;
   forming an insulating layer on the metal contact pad;
   forming a patterned photoresist layer over the insulating layer;
   using the patterned photoresist layer as a mask to remove a portion of the insulating layer to expose a portion of the metal contact pad, thereby forming an exposed portion of the metal contact pad;
   depositing solder on the exposed portion of the metal contact pad after the mask is removed such that the depositing solder is performed with using the insulator as a mask, wherein depositing solder on the exposed portion of the metal contact pad uses a deposition process selected from a group consisting of selective chemical vapor deposition and selective electrolytic deposition, thereby forming a solder contact by selectively depositing solder and without removing a remaining portion of the insulating layer; and annealing the solder contact to form a solder ball contact having a diameter in a range of about 2.5 microns to no greater than 100 microns.

2. The method of claim 1, wherein depositing solder further comprises depositing at least one material selected from a group consisting of lead, tin and bismuth.

3. The method of claim 1, wherein forming a metal contact pad further comprises:

forming a layer of zirconium on the substrate;

forming a layer of nickel on the layer of zirconium;

forming a layer of copper on the layer of nickel;

forming a layer of gold on the layer of copper; and forming a layer of lead on the layer of gold.

4. The method of claim 1, wherein forming a metal contact pad further comprises:

forming a layer of zirconium on the substrate, wherein the layer of zirconium is approximately 500 Angstroms thick;

forming a layer of nickel on the layer of zirconium, wherein the layer of nickel is approximately 750 Angstroms thick;

forming a layer of copper on the layer of nickel, wherein the layer of copper is approximately 5000 Angstroms thick;

forming a layer of gold on the layer of copper, wherein the layer of gold is approximately 750 Angstroms thick; and forming a layer of lead on the layer of gold, wherein the layer of lead is approximately 500 Angstroms thick.

5. The method of claim 1, wherein annealing the solder contact to form a solder ball contact comprises a solder ball contact approximating a spherical shape.

6. The method of claim 1, wherein annealing the solder contact to form a solder ball contact comprises a solder ball contact having a spherical portion and a flat contact portion.

7. The method of claim 1, wherein removing a portion of the insulating layer further comprises forming an exposed portion of the metal contact pad having a diameter of approximately 2 microns.

8. A method of forming a solder ball contact, comprising:

forming a metal contact pad on a substrate;

forming an insulating layer on the metal contact pad;

forming a patterned photoresist layer over the insulating layer;

using the patterned photoresist layer as a mask to remove a portion of the insulating layer to expose a portion of the metal contact pad, thereby forming an exposed portion of the metal contact pad;

removing the patterned photoresist layer;

depositing solder on the exposed portion of the metal contact pad after the patterned photoresist layer is removed such that the depositing solder is performed with using the insulator as a mask, thereby forming a solder contact by selectively depositing solder;

maintaining remaining portions of the insulating layer surrounding the solder; and annealing the solder contact to form a solder ball contact having a diameter in a range of about 2.5 microns to no greater than 100 microns.

9. The method of claim 8, wherein depositing solder comprises depositing at least one material selected from the group consisting of lead, tin and bismuth.

10. A method of forming a solder ball contact, comprising:

forming a metal contact pad on a substrate;

forming an insulating layer on the metal contact pad;

forming a patterned photoresist layer over the insulating layer;

using the patterned photoresist layer as a mask to remove a portion of the insulating layer to expose a portion of the metal contact pad, thereby forming an exposed portion of the metal contact pad, wherein the exposed portion of the metal contact pad has a diameter of approximately 2 microns;

removing the patterned photoresist layer;

selectively depositing lead on the exposed portion of the metal contact pad after the patterned photoresist layer is removed such that the selectively depositing lead is performed with using the insulator as a mask, thereby forming a solder contact in which solder is selectively deposited; and annealing the solder contact to form a solder ball contact without removing remaining portions of the insulating layer.

11. A method of forming a solder ball contact, comprising:

forming a metal contact pad on a substrate;

forming an insulating layer on the metal contact pad;

forming a patterned photoresist layer over the insulating layer;

forming a patterned photoresist layer as a mask to remove a portion of the insulating layer to expose a portion of the metal contact pad, thereby forming an exposed portion of the metal contact pad, the exposed portion having a predetermined diameter;

removing the patterned photoresist layer;

adsorbing reactants on the exposed portion of the metal contact pad;

reacting the reactants on the exposed portion of the metal contact pad, thereby forming a solder contact only on the exposed portion of the metal contact pad and not on the insulating layer, wherein the solder contact is formed after the patterned photoresist layer is removed such that the solder contact is formed using the insulator as a mask;

annealing the solder contact to form a solder ball contact having a diameter in a range of about 2.5 microns to no greater than 100 microns; and leaving remaining portions of the insulating layer as a passivation layer.

12. The method of claim 7 wherein annealing the solder contact further comprises annealing the solder contact to form a solder ball contact having a diameter of approximately 2.5 microns.

13. The method of claim 10 wherein annealing the solder contact further comprises annealing the solder contact to form a solder ball contact having a diameter of approximately 2.5 microns.

14. The method of claim 1 performed in the order recited.

15. A method of forming a solder ball contact, consisting essentially of:

forming a metal contact pad on a substrate;

forming an insulating layer on the metal contact pad;

forming a patterned photoresist layer over the insulating layer;

using the patterned photoresist layer as a mask to remove a portion of the insulating layer to expose a portion of the metal contact pad, thereby forming an exposed portion of the metal contact pad, the exposed portion having a predetermined diameter;

depositing solder on the exposed portion of the metal contact pad to form a solder contact using selective deposition after the patterned photoresist layer is removed such that the depositing solder is performed using the insulator as a mask; and annealing the solder contact to form a solder ball contact having a diameter in a range of about 2.5 microns to no greater than 100 microns.

16. A method comprising:

forming a metal layer on a substrate;

forming a first insulating layer over the metal layer;

forming a first patterned photoresist layer over the metal layer;

removing the first patterned photoresist layer;

removing a portion of the first insulating layer to form an exposed portion of the metal layer;

forming a metal contact over the first insulating layer and connecting to the exposed portion of the metal layer;

forming a second insulating layer over the metal contact;

forming a second patterned photoresist layer over the second insulating layer;

using the second patterned photoresist layer as a mask, removing a portion of the second insulating layer to form an exposed portion of the metal contact;

removing the second patterned photoresist layer;

depositing solder on the exposed portion of the metal contact after the second patterned photoresist layer is removed with using the insulator layer as a mask to form a solder contact; and annealing the solder contact to form a solder ball contact.

17. The method of claim 16, wherein forming a metal contact includes forming a metal stack of zirconium, nickel, copper, gold, and lead.

18. The method of claim 16, wherein forming a metal contact includes forming the metal contact having a diameter of approximately 2 microns.

19. The method of claim 16, wherein depositing solder is performed by selective chemical vapor deposition.

20. The method of claim 16, wherein depositing solder is performed by selective electrolytic deposition.

21. The method of claim 16, wherein depositing solder includes depositing at least one material selected from a group consisting of lead, tin and bismuth.

22. The method of claim 16, wherein annealing the solder contact includes annealing the solder contact to form a solder ball contact having a diameter in a range of about 2.5 microns to no greater than 100 microns.

23. A method comprising:

forming a metal layer on a substrate;

forming a first insulating layer over the metal layer;

removing a portion of the first insulating layer to form an exposed portion of the metal layer;

forming a metal contact over the first insulating layer and connecting to the exposed portion of the metal layer;

forming a second insulating layer over the metal contact;

removing a portion of the second insulating layer to form an exposed portion of the metal contact;

depositing solder on the exposed portion of the metal contact using the second insulator layer as a mask to form a solder contact; and annealing the solder contact to form a solder ball contact.

24. The method of claim 23 further comprising:

forming a first patterned photoresist layer over the first insulating layer to remove the portion of first insulating layer to form the exposed portion of the metal layer.

25. The method of claim 24 further comprising:

forming a second patterned photoresist layer over the second insulating layer to remove the portion of second insulating layer to form the exposed portion of the metal contact.

26. The method of claim 25, wherein depositing solder on the exposed portion of the metal contact is performed after the second photoresist layer is removed such that the depositing solder on the exposed portion of the metal contact includes no photoresist layer used as a mask when the solder is deposited.

27. The method of claim 23, wherein forming a metal contact includes forming a metal stack of zirconium, nickel, copper, gold, and lead.

28. The method of claim 23, wherein forming a metal contact includes forming the metal contact having a diameter of approximately 2 microns.

29. The method of claim 23, wherein depositing solder is performed by selective chemical vapor deposition.

30. The method of claim 23, wherein depositing solder is performed by selective electrolytic deposition.

31. The method of claim 23, wherein annealing the solder contact includes annealing the solder contact to form a solder ball contact having a diameter in a range of about 2.5 microns to no greater than 100 microns.

* * * * *

UNITED STATES PATENT AND TRADEMARK OFFICE
CERTIFICATE OF CORRECTION

PATENT NO. : 6,844,253 B2
DATED : January 18, 2005
INVENTOR(S) : Paul A. Farrar

It is certified that error appears in the above-identified patent and that said Letters Patent is hereby corrected as shown below:

Column 1,
Line 11, delete "modem" and insert -- modern --, therefor.

Column 12,
Line 5, delete "the" and insert -- a --, therefor.
Line 36, delete "forming" and insert -- using --, therefor.

Column 13,
Line 40, after "removed" insert -- , --.
Line 40, after "removed" delete "with".
Line 40, after "mask" insert -- , --.

Column 14,
Line 19, after "contact" insert -- , --.
Line 19, after "insulator" delete "layer".
Line 19, after "mask" insert -- , --.

Signed and Sealed this

Twenty-fourth Day of May, 2005

JON W. DUDAS
*Director of the United States Patent and Trademark Office*